United States Patent
Kim et al.

(10) Patent No.: US 11,849,594 B2
(45) Date of Patent: Dec. 19, 2023

(54) QUANTUM DOT EMITTING DIODE AND QUANTUM DOT DISPLAY DEVICE INCLUDING THE SAME

(71) Applicant: LG Display Co., Ltd., Seoul (KR)

(72) Inventors: Min-Jee Kim, Paju-si (KR); Sung-Il Woo, Paju-si (KR); Hye-Ock Choi, Paju-si (KR); Ji-Yeon Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 46 days.

(21) Appl. No.: 16/129,114

(22) Filed: Sep. 12, 2018

(65) Prior Publication Data
US 2019/0081262 A1  Mar. 14, 2019

(30) Foreign Application Priority Data

Sep. 12, 2017 (KR) .................. 10-2017-0116500
Sep. 10, 2018 (KR) .................. 10-2018-0107719

(51) Int. Cl.
*H10K 50/115* (2023.01)
*C08L 29/04* (2006.01)
(Continued)

(52) U.S. Cl.
CPC .............. *H10K 50/115* (2023.02); *C08K 3/22* (2013.01); *C08K 3/36* (2013.01); *C08L 29/04* (2013.01);
(Continued)

(58) Field of Classification Search
CPC ............ H01L 51/5072; H01L 51/5076; H01L 51/508; H01L 51/5084; H01L 51/502;
(Continued)

(56) References Cited

U.S. PATENT DOCUMENTS 9,379,344 B2 * 6/2016 Yang .................... H01L 51/5036
2004/0036130 A1 * 2/2004 Lee ....................... G02F 1/3515
257/E29.082
(Continued)

FOREIGN PATENT DOCUMENTS

CN   102365767 A   2/2012
CN   103050640 A   4/2013
(Continued)

OTHER PUBLICATIONS

Notification of First Office Action dated May 7, 2020, issued in corresponding Chinese Patent Application No. 201811065048.5.
(Continued)

*Primary Examiner* — Jesse Y Miyoshi
(74) *Attorney, Agent, or Firm* — Morgan, Lewis & Bockius LLP

(57) ABSTRACT

A quantum dot emitting diode includes first and second electrodes facing each other; a quantum dot emitting material layer between the first and second electrodes; and an electron transporting layer including an electron transporting material and disposed between the quantum dot emitting material layer and the second electrode, wherein the electron transporting material includes a core of metal oxide and a shell of silica.

8 Claims, 15 Drawing Sheets

(51) Int. Cl.
*C08K 3/22* (2006.01)
*C08K 3/36* (2006.01)
*C09D 129/04* (2006.01)
*H10K 50/16* (2023.01)
*H10K 50/81* (2023.01)
*H10K 50/82* (2023.01)
*H10K 50/17* (2023.01)
*H10K 59/121* (2023.01)
*H10K 50/15* (2023.01)
*H10K 50/165* (2023.01)
*H10K 102/00* (2023.01)

(52) U.S. Cl.
CPC ........... *C09D 129/04* (2013.01); *H10K 50/16* (2023.02); *H10K 50/171* (2023.02); *H10K 50/81* (2023.02); *H10K 50/82* (2023.02); *H10K 59/1213* (2023.02); *C08K 2003/2217* (2013.01); *C08K 2003/2231* (2013.01); *C08K 2003/2296* (2013.01); *C08L 2207/53* (2013.01); *H10K 50/15* (2023.02); *H10K 50/165* (2023.02); *H10K 2102/331* (2023.02); *H10K 2102/351* (2023.02)

(58) Field of Classification Search
CPC .... H10K 50/16; H10K 50/165; H10K 50/166; H10K 50/167; H10K 50/171; H10K 50/155
See application file for complete search history.

(56) References Cited

U.S. PATENT DOCUMENTS

| | | | |
|---|---|---|---|
| 2010/0283037 A1* | 11/2010 | Omata | C09K 11/621 257/14 |
| 2012/0043532 A1* | 2/2012 | Yasuda | H01L 51/5072 257/40 |
| 2013/0019937 A1 | 1/2013 | So et al. | |
| 2013/0200360 A1* | 8/2013 | Oikawa | H01L 51/502 257/40 |
| 2014/0302627 A1* | 10/2014 | Ko | H01L 51/5072 252/301.16 |
| 2015/0318506 A1* | 11/2015 | Zhou | G02B 5/201 257/40 |
| 2016/0233449 A1* | 8/2016 | Murayama | C09K 11/883 |
| 2017/0271606 A1* | 9/2017 | Choi | H01L 51/5072 |

FOREIGN PATENT DOCUMENTS

| | | |
|---|---|---|
| CN | 103840053 A | 6/2014 |
| CN | 106784348 A | 5/2017 |
| KR | 10-2012-0029096 A | 3/2012 |

OTHER PUBLICATIONS

Office Action dated Jul. 5, 2023, issued in corresponding Korean Patent Application No. 10-2018-0107719.

* cited by examiner

10

100

D

342

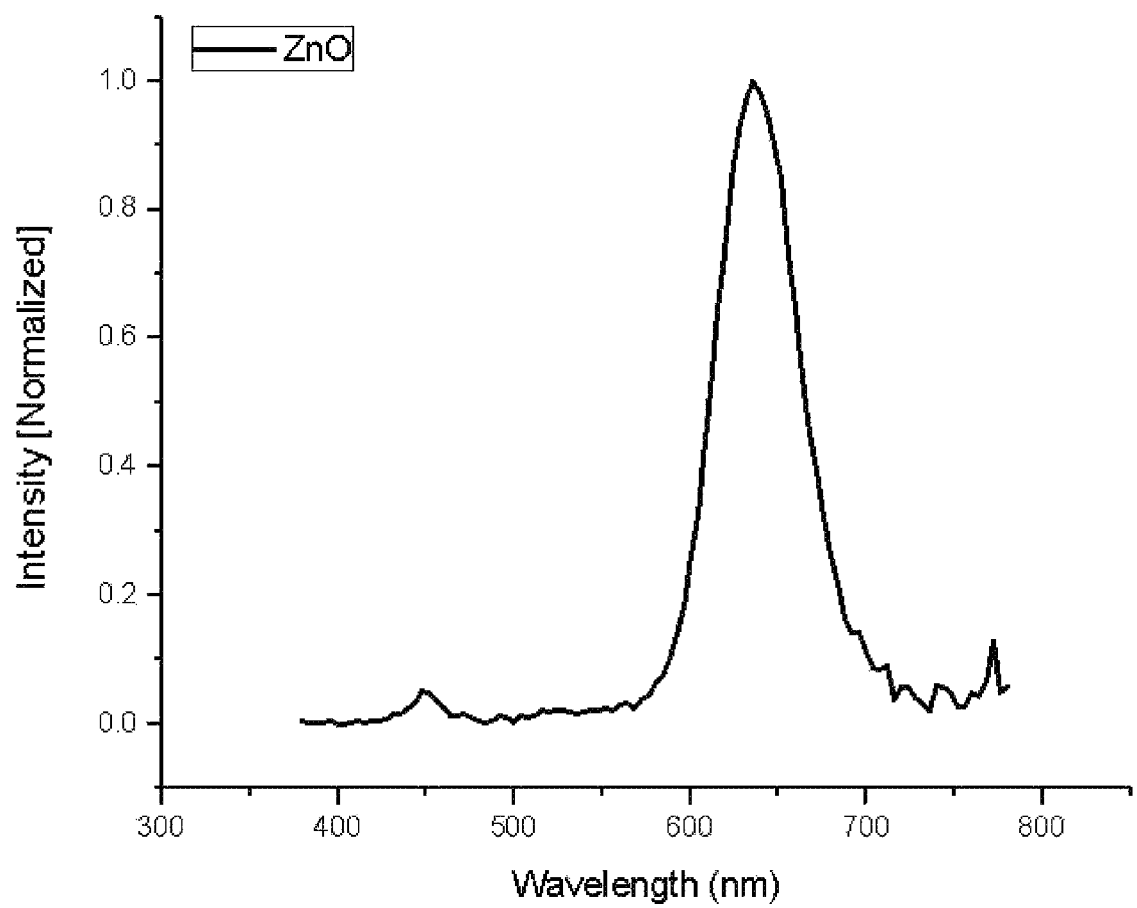

442

QUANTUM DOT EMITTING DIODE AND QUANTUM DOT DISPLAY DEVICE INCLUDING THE SAME

CROSS-REFERENCE TO RELATED APPLICATIONS

The present application claims the benefit of Korean Patent Application No. 10-2017-0116500 filed in the Republic of Korea on Sep. 12, 2017, and Korea Patent Application No. 10-2018-0107719 filed on Sep. 10, 2018, all of which are hereby incorporated by reference in their entirety into the present application.

BACKGROUND

Technical Field

The present disclosure relates to a quantum dot (QD) emitting diode, and more particularly, to a QD emitting diode having improved charge balance and a QD display device including the same.

Discussion of the Related Art

As information technology and mobile communication technology have been developed, a display device being capable of displaying a visual image has also been developed. Flat panel display devices, such as a liquid crystal display (LCD) device a plasma display panel (PDP) device and an electroluminescent display device, are developed and used because of advantages in weight, power consumption, and so on.

Recently, use of a QD to display devices has been researched or studied.

In the QD, an electron in an unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

FIG. 1 is a schematic cross-sectional view of the related art QD emitting diode.

As shown in FIG. 1, the QD emitting diode 10 includes a first electrode 20, a second electrode 80 facing the first electrode 20, a QD emitting material layer (EML) 50 positioned between the first and second electrodes 20 and 80, a hole injection layer (HIL) 30 and a hole transporting layer (HTL) 40 sequentially stacked between the first electrode 20 and the QD EML 50, and an electron transporting layer (ETL) 60 and an electron injection layer (EIL) 70 sequentially stacked between the QD EML 50 and the second electrode 80.

For example, the first electrode 20 may serve as an anode, and the second electrode 80 may serve as a cathode.

In the QD emitting diode 10, the hole from the first electrode 20 is transferred into the QD EML 50 through the HIL 30 and the HTL 40, and the electron from the second electrode 80 is transferred into the QD EML 50 through the EIL 70 and the ETL 60.

However, in the related art QD emitting diode, the charge balance is destroyed such that the emitting efficiency of the QD emitting diode is decreased.

Namely, in the related art QD emitting diode, since the electron is injected into the QD EML to be easier and faster than the hole, the charge balance in the QD EML is destroyed such that the emission may be generated at an interface between the QD EML and the HTL.

SUMMARY

Accordingly, embodiments of the present disclosure are directed to a QD emitting diode and a QD display device that substantially obviate one or more of the problems due to limitations and disadvantages of the related art.

An object of the present disclosure is to provide a QD emitting diode and a QD display device having improved charge balance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a quantum dot emitting diode comprises first and second electrodes facing each other; a quantum dot emitting material layer between the first and second electrodes; and an electron transporting layer including an electron transporting material and disposed between the quantum dot emitting material layer and the second electrode, wherein the electron transporting material includes a core of metal oxide and a shell of silica.

In another aspect, a quantum dot emitting diode comprises first and second electrodes facing each other; a quantum dot emitting material layer between the first and second electrodes; and an electron transporting layer including an electron transporting material and disposed between the quantum dot emitting material layer and the second electrode, wherein the electron transporting material includes a core of metal oxide and a shell of PVA.

In another aspect, a quantum dot display device comprises a substrate; a quantum dot emitting diode on the substrate, the emitting diode including: first and second electrodes facing each other; a quantum dot emitting material layer between the first and second electrodes; and an electron transporting layer including an electron transporting material and disposed between the quantum dot emitting material layer and the second electrode; and a thin film transistor disposed between the substrate and the quantum dot emitting diode and connected to the quantum dot emitting diode, wherein the electron transporting material includes a core of metal oxide and a shell of silica or PVA.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

FIGS. 9A to 9D are graphs showing an emission peak of the QD emitting diode including the electron transporting material with or without a silica shell.

DETAILED DESCRIPTION

Reference will now be made in detail to the preferred embodiments, examples of which are illustrated in the accompanying drawings.

Figure 1:
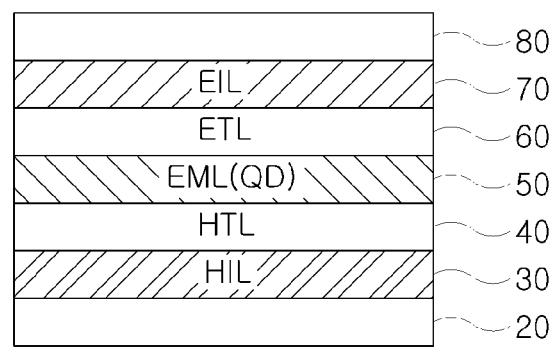
FIG. 1 is a schematic cross-sectional view of the related art QD emitting diode.
Figure 2:
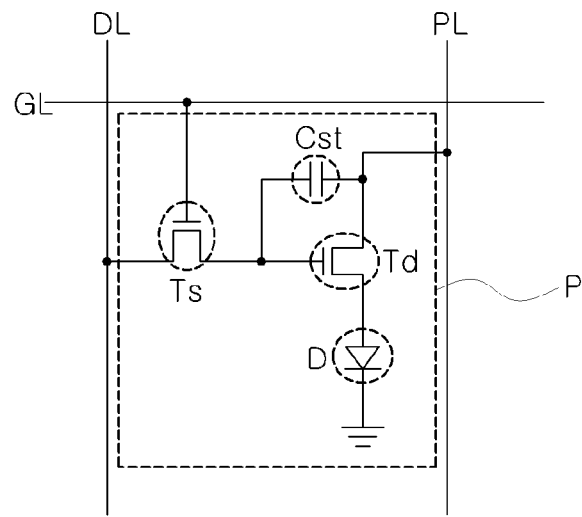
FIG. 2 is a schematic circuit diagram of a QD display device according to the present invention.

FIG. 2 is a schematic circuit diagram of a QD display device according to the present invention.

As shown in FIG. 2, in a QD display device, a gate line GL and a data line DL are formed, and a pixel region P is defined by the gate and data lines GL and DL. In addition, a power line PL, which crosses the gate line GL, is formed. In the pixel region P, a switching thin film transistor (TFT) Ts, a driving TFT Td, a storage capacitor Cst and a QD emitting diode D are formed.

The switching TFT Ts is connected to the gate line GL and the data line DL, and the driving TFT Td and the storage capacitor Cst are connected between the switching TFT Ts and the power line PL. The QD emitting diode D is connected to the driving TFT Td.

In the QD display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current proportional to the data signal is supplied to the QD emitting diode D from the power line PL through the driving TFT Td. As a result, the QD emitting diode D emits light according to the current through the driving TFT Td.

The storage capacitor Cst serves to maintain the voltage of the gate electrode of the driving TFT Td for one frame. Accordingly, the QD display device displays images.

Figure 3:
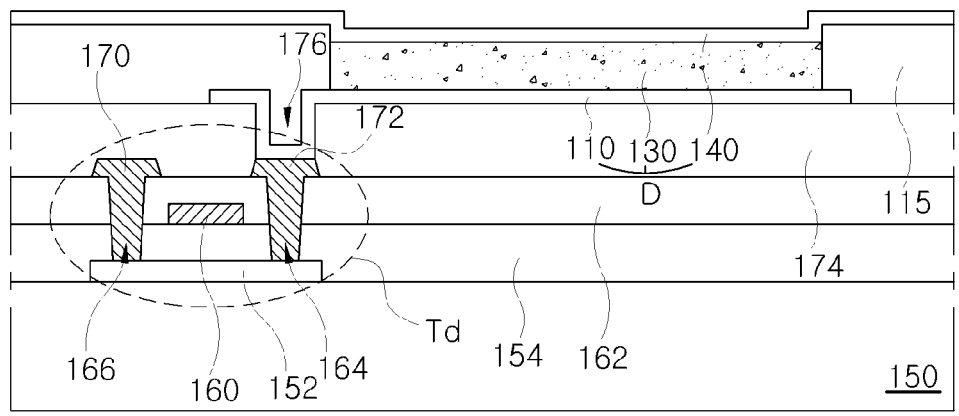
FIG. 3 is a schematic cross-sectional view of a QD display device according to the present invention.

FIG. 3 is a schematic cross-sectional view of a QD display device according to the present invention.

As shown in FIG. 3, a QD display device 100 includes a substrate 150, a TFT Td on the substrate 150 and a QD emitting diode D over the substrate 150 and connected to the TFT Td.

The substrate 150 may be a glass substrate or a plastic substrate. For example, the substrate 150 may be a polyimide substrate.

Although not shown, a buffer layer of an inorganic material, e.g., silicon oxide or silicon nitride, may be formed on the substrate 150.

The TFT Td is connected to the switching TFT and includes a semiconductor layer 152, a gate electrode 160, a source electrode 170 and a drain electrode 172.

The semiconductor layer 152 is formed on the substrate 150. The semiconductor layer 152 may be formed of an oxide semiconductor material or polycrystalline silicon.

When the semiconductor layer 152 is formed of the oxide semiconductor material, a light-shielding pattern (not shown) may be formed under the semiconductor layer 152. Accordingly, the light to the semiconductor layer 152 is shielded or blocked by the light-shielding pattern such that thermal degradation of the semiconductor layer 152 can be prevented. On the other hand, when the semiconductor layer 152 is formed of the polycrystalline silicon, impurities may be doped into both sides of the semiconductor layer 152.

A gate insulating layer 154 is formed on the semiconductor layer 152. The gate insulating layer 154 may be formed of an inorganic insulating material such as silicon oxide or silicon nitride.

A gate electrode 160, which is formed of a conductive material, e.g., metal, is formed on the gate insulating layer 154 to correspond to a center portion of the semiconductor layer 152. The gate electrode 160 is connected to the switching TFT.

The gate insulating layer 154 is formed on the entire surface of the substrate 150. Alternatively, the gate insulating layer 154 may be patterned to have the same shape as the gate electrode 160.

An interlayer insulating layer 162, which is formed of an insulating material, is formed on the entire surface of the substrate 150 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 164 and 166 exposing both sides of the semiconductor layer 152. The first and second contact holes 164 and 166 are positioned at both sides of the gate electrode 160 to be spaced apart from the gate electrode 160.

The first and second contact holes 164 and 166 extend into the gate insulating layer 154. Alternatively, when the gate insulating layer 154 is patterned to have the same shape as the gate electrode 160, there may be no first and second contact holes 164 and 166 in the gate insulating layer 154.

A source electrode 170 and a drain electrode 172, which are formed of a conductive material, e.g., metal, are formed on the interlayer insulating layer 162. The source electrode 170 and the drain electrode 172 are spaced apart from each other with respect to the gate electrode 160 and respectively contact both sides of the semiconductor layer 152 through the first and second contact holes 164 and 166. The source electrode 170 is connected to the power line PL (of FIG. 2).

The TFT Td including the semiconductor layer 152, the gate electrode 160, the source electrode 170 and the drain electrode 172 serves as a driving element.

The gate electrode 160, the source electrode 170 and the drain electrode 172 are positioned over the semiconductor layer 152. Namely, the TFT Td has a coplanar structure.

Alternatively, in the TFT Td, the gate electrode may be positioned under the semiconductor layer, and the source and drain electrodes may be positioned over the semiconductor layer such that the TFT Td may have an inverted staggered structure. In this instance, the semiconductor layer may be formed of amorphous silicon.

On the other hand, the switching TFT may have substantially the same structure as the TFT Td.

A passivation layer 174, which includes a drain contact hole 176 exposing the drain electrode 172 of the TFT Td, is formed to cover the TFT Td.

A first electrode 110, which is connected to the drain electrode 172 of the TFT Td through the drain contact hole 176, is separately formed on the passivation layer 174 in each pixel region.

The first electrode 110 may be an anode and may be formed of a conductive material having a relatively high work function. For example, the first electrode 110 may be formed of a transparent conductive material such as indium-tin-oxide (ITO) and indium-zinc-oxide (IZO).

When the QD display device 100 of the present disclosure is a top-emission type, a reflection electrode or a reflection layer may be formed under the first electrode 110. For example, the reflection electrode or the reflection layer may be formed of an aluminum-palladium-copper (APC) alloy.

A bank layer 115, which covers edges of the first electrode 110, is formed on the passivation layer 174. The bank 115 exposes a center region of the first electrode 110 in the pixel region.

An emitting layer 130 is formed on the first electrode 110. The emitting layer 130 will be explained in more detail.

A second electrode 140 is formed on the emitting layer 130 over the substrate 150. The second electrode 140 is positioned at the entire surface of the display area. The second electrode 140 may be a cathode and may be formed of a conductive material having a relatively low work function. For example, the second electrode 140 may be formed of one of aluminum (Al), magnesium (Mg) and an Al—Mg alloy.

The first electrode 110, the emitting layer 130 and the second electrode 140 constitute the QD emitting diode D.

In the QD emitting diode D of the present disclosure, an ETL in the emitting layer 130 includes an electron transporting material comprising a mixture of metal oxide and silica or a core-shell structure of a metal oxide core and a silica shell such that the emitting efficiency of the QD display device 100 is improved.

Figure 4:
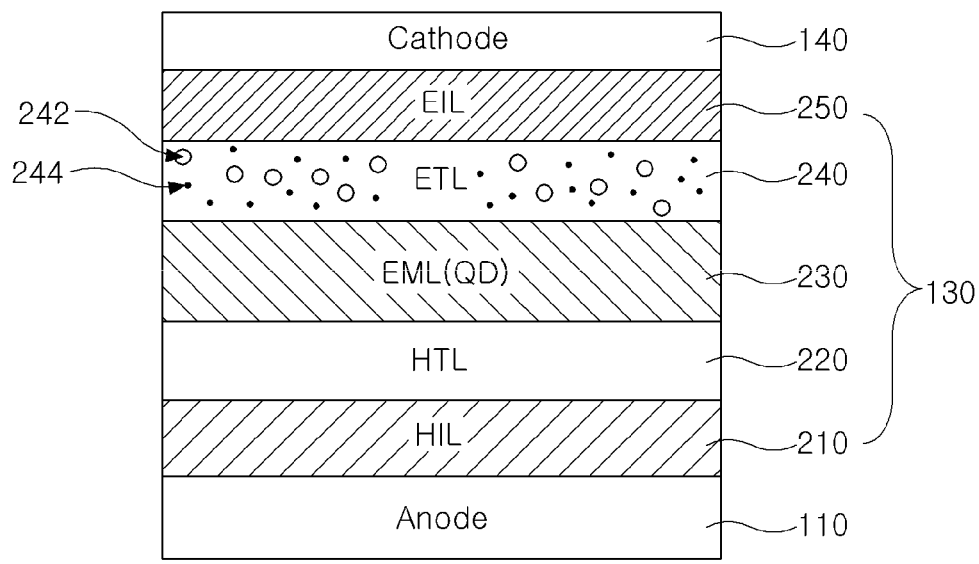
FIG. 4 is a schematic cross-sectional view of a QD emitting diode according to a first embodiment of the present invention.

FIG. 4 is a schematic cross-sectional view of a QD emitting diode according to a first embodiment of the present invention.

As shown in FIG. 4, the QD emitting diode D includes the first electrode 110, the second electrode 140 facing the first electrode 110 and the emitting layer 130, and the emitting layer 130 includes a QD EML 230, an HTL 220 between the first electrode 110 and the QD EML 230 and an ETL 240 between the QD EML 230 and the second electrode 140.

The first electrode 110 may be an anode, and the second electrode 140 may be a cathode.

The QD EML 230 may include a plurality of QDs (not shown). The QD may include a semiconductor material.

The QD may include a core at a center region and a shell covering the core. The light is emitted from the core. In addition, a ligand for dispersing the QD in the solvent may be combined at a surface of the shell. The core and the shell have a difference in an energy bandgap.

The QD may be formed of a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

The HTL 220 includes a hole transporting material and may contact one surface of the QD EML 230.

The ETL 240 includes an electron transporting material 242 of metal oxide and a silica ($SiO_2$) particle 244 and may contact the other surface of the QD EML 230.

The electron transporting material 242 has a first electron mobility. For example, the electron transporting material 242 may be at least one of ZnO, ZnMgO and $SnO_2$.

The silica particle 244 has a second electron mobility being smaller than the first electron mobility. The silica particle 244 may be doped into the electron transporting material 242.

The emitting layer 130 may further include an HIL 210 between the first electrode 110 and the HTL 220 and an EIL 250 between the second electrode 140 and the ETL 240. At least one of the HIL 210 and the EIL 250 may be omitted.

Figure 5:
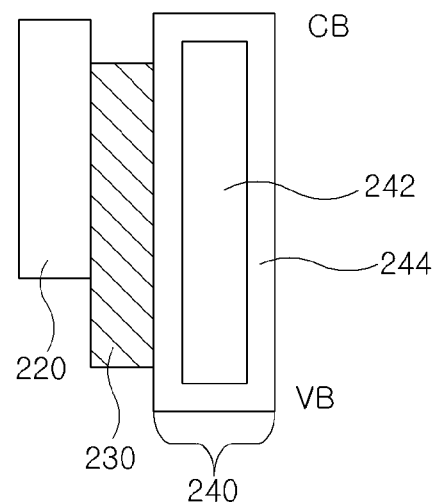
FIG. 5 is a schematic view illustrating an energy diagram in the QD emitting diode according to the first embodiment of the present invention.

Referring to FIG. 5, which is a schematic view illustrating an energy diagram in the QD emitting diode according to the first embodiment of the present invention, the HTL 220 has a highest occupied molecular orbital (HOMO) level being higher than a valance band (VB) level of the QD EML 230.

In addition, the electron transporting material 242 has a conduction band (CB) level being higher than the CB level of the QD EML 230.

Since a difference between the CB level of the electron transporting material 242 and the CB level of the QD EML 230 is smaller than a difference between the HOMO level of the HTL 220 and the VB level of the QD EML 230, the electron is injected into the QD EML 230 to be easier and faster than the hole. Namely, the metal oxide electron transporting material 242 is used for the ETL 240, the charge balance in the QD emitting diode D is destroyed.

However, in the QD emitting diode D of the present invention, since the ETL 240 further includes the silica particle 244, which has an energy band gap being greater than that of the electron transporting material 242 and the CB level higher than that of the electron transporting material 242, the charge balance in the QD emitting diode D is improved. Namely, the electron transport from the ETL 240 into the QD EML 230 is decreased by the silica particle 244.

In addition, since the silica particle 244 has the VB level being lower than the electron transporting material 242, the hole blocking property is improved.

Accordingly, the charge balance in the QD EML 230 is further improved, and the emitting efficiency of the QD display device is also improved.

However, when the doping ratio (doping amount) of the silica particle 244 is increased, a problem in the dispersion of the silica particle 244 with the metal oxide electron transporting material 242 is generated. Namely, it is difficult to form the ETL 240 by a solution process, and the property of the ETL 240 becomes non-uniform by the dispersion non-uniformity of the silica particle 244 and the electron transporting material 242.

Accordingly, there is a limitation in improvement of the charge balance and the emitting efficiency of the QD emitting diode.

Figure 6:
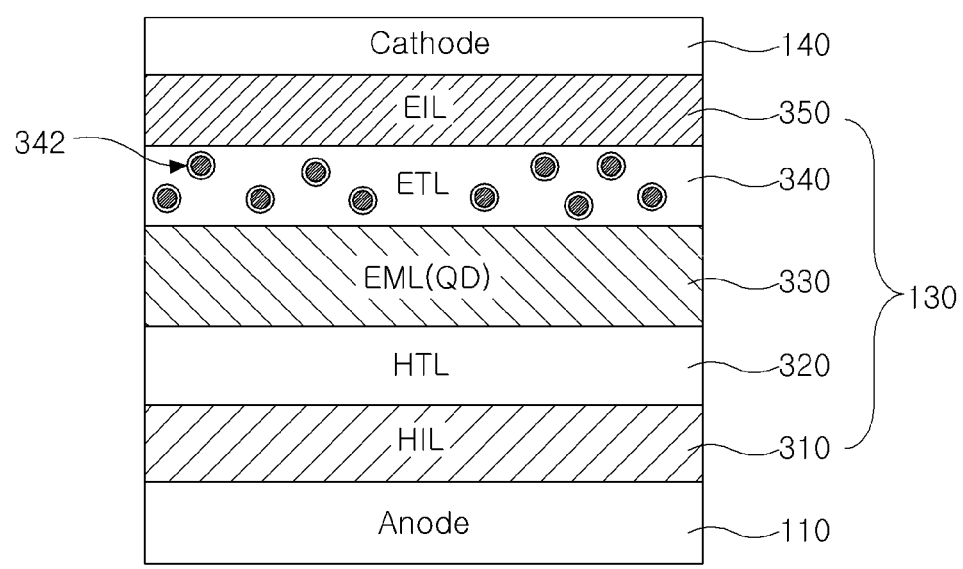
FIG. 6 is a schematic cross-sectional view of a QD emitting diode according to a second embodiment of the present invention.

FIG. 6 is a schematic cross-sectional view of a QD emitting diode according to a second embodiment of the present invention.

As shown in FIG. 6, the QD emitting diode D includes the first electrode 110, the second electrode 140 facing the first electrode 110 and the emitting layer 130 therebetween, and the emitting layer 130 includes a QD EML 330, an HTL 320 between the first electrode 110 and the QD EML 330 and an ETL 340 between the QD EML 330 and the second electrode 140.

The first electrode 110 may be an anode, and the second electrode 140 may be a cathode.

The QD EML 330 may include a plurality of QDs (not shown). The QD may include a semiconductor material. The QD may include a core at a center region and a shell covering the core. The light is emitted from the core. In addition, a ligand for dispersing the QD in the solvent may be combined at a surface of the shell. The core and the shell have a difference in an energy bandgap.

The QD may be formed of a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

The HTL 320 includes a hole transporting material and may contact one surface of the QD EML 330.

The ETL 340 includes an electron transporting material 342 and may contact the other surface of the QD EML 330. The electron transporting material 342 includes a core of metal oxide and a shell of silica.

Figure 7:
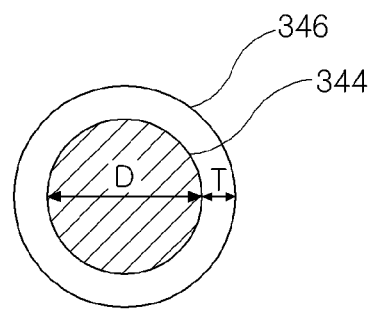
FIG. 7 is a schematic view illustrating an electron transporting material used in the QD emitting diode according to the second embodiment of the present invention.

Referring to FIG. 7, which is a schematic view illustrating an electron transporting material used in the QD emitting diode according to the second embodiment of the present invention, the electron transporting material 342 includes the core 344 and the shell 346 surrounding (covering or enclosing) the core 344.

The core 344 includes a metal oxide material. For example, the core 344 may include at least one of ZnO, ZnMgO and $SnO_2$. The core 344 has a size, e.g., a diameter, D of about 5 to 10 nm, preferably, about 7 to 8 nm.

When the size D of the core 344 is too small, e.g., less than 5 nm, the electron transporting material 342 does not has a desired energy bandgap. When the size D of the core 344 is too big, e.g., above 10 nm, an air gap or a pore is generated between the electron transporting materials 342 or a coating uniformity is degraded. As a result, the emitting efficiency of the QD emitting diode D is decreased.

The shell 346 encloses the core 344 and includes silica ($SiO_2$). The electron trap problem by the defect in the core 344 is prevented by the shell 346. The shell 346 may have a thickness T of about 1.5 to 3.5 nm, preferably, about 2 to 3 nm.

When the thickness T of the shell 346 is too small, e.g., less than 1.5 nm, the uniformity of the shell 346 is secured such that the property of the electron transporting material 342 is degraded. When the thickness T of the shell 346 is too big, e.g., above 3.5 nm, aggregation of the electron transporting materials 342 may be generated and the electron transport may be blocked by the shell 346.

The emitting layer 130 may further include an HIL 310 between the first electrode 110 and the HTL 320 and an EIL 350 between the second electrode 140 and the ETL 340. At least one of the HIL 310 and the EIL 350 may be omitted.

Figure 8:
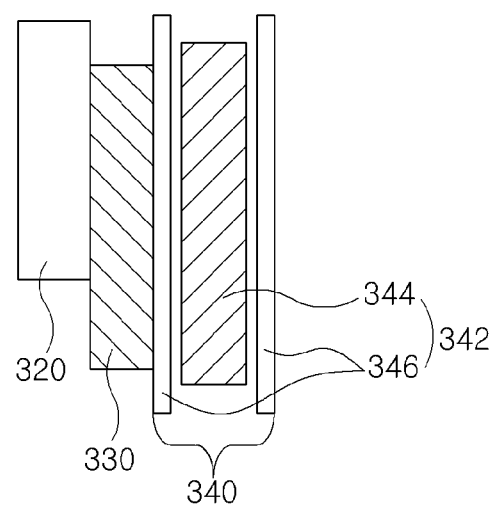
FIG. 8 is a schematic view illustrating an energy diagram in the QD emitting diode according to the second embodiment of the present invention.

Referring to FIG. 8, which is a schematic view illustrating an energy diagram in the QD emitting diode according to the second embodiment of the present invention, the HTL 320 has a HOMO level being higher than a VB level of the QD EML 330.

In addition, the electron transporting material 342 has a CB level being higher than the CB level of the QD EML 330. The silica shell 346 has an electron mobility being smaller than the metal oxide core 344 and an energy bandgap being greater than the metal oxide core 344. In addition, the silica shell 346 has a CB level being higher than the metal oxide core 344 and a VB level being lower than the metal oxide core 344. Accordingly, the hole is efficiently blocked by the silica shell 346, and the electron transporting property of the ETL 340 is decreased. As a result, the charge balance in the QD EML 330 is improved, and the emitting efficiency of the QD display device is also improved.

The charge balance improvement may depend on the thickness T of the shell 346, and the electron transporting (injection) property and the hole blocking property by the silica shell 346 may be controlled by controlling the thickness T of the shell 346.

In addition, silica is used as a shell 346 for the core 344, there is no dispersion problem in silica and metal oxide such that the ETL 340 may be formed by a solution process. In this instance, since all elements of the emitting layer 130 can be formed by the solution process, a large-size QD display device can be efficiently manufactured.

[Synthesis]
1. Synthesis ZnO—$SiO_2$ Electron Transporting Material
(1) ZnO Core Dimethyl sulfoxide (DMSO, 30 ml), where 0.1M zinc acetate hydrate was dissolved, and ethanol solution (10 ml), where 0.5M tetramethylammonium hydroxide (TMAH) was dissolved, were mixed and stirred for 1 hr. After completion of the reaction, the mixture was precipitated by using ethyl acetate, and the precipitate was separated by using the centrifuge. By performing the dispersion step using dispersion stabilizer (2-ethanolamine, 160 μl) and the precipitation step using ethanol and ethyl acetate, ZnO nano-particle was obtained.

(2) $SiO_2$ Shell

ZnO nano-particles (25 mg) were dispersed in distilled water (20 ml), and polyvinylpyrrolidone (PVP, 0.2 g) was added into the solution. The mixture was stirred for one day to substitute ZnO surface by PVP. After centrifugation, particles was dispersed in a mixture solution of ethanol (23 ml), distilled water (4.3 ml) and ammonia water (30%, JUNSEI 13370-0380), and tetraethyl orthosilicate (TEOS, 0.05 ml) was added. The mixture was stirred under the room temperature for 4 hrs, and ZnO—$SiO_2$ particle was obtained by centrifugation.

2. Synthesis ZnMgO—$SiO_2$ Electron Transporting Material
(1) ZnMgO Core

DMSO (27 ml), where 0.1M zinc acetate hydrate was dissolved, and DMSO (3 ml), where 0.1M magnesium acetate was dissolved, were mixed and stirred for 30 minutes. Ethanol solution (10 ml), where 0.5M TMAH was dissolved, were added and stirred for 1 hr. After completion of the reaction, the mixture was precipitated by using ethyl acetate, and the precipitate was separated by using the centrifuge. By performing the dispersion step using dispersion stabilizer (2-ethanolamine, 160 μl) and the precipitation step using ethanol and ethyl acetate, ZnMgO nano-particle was obtained.

(2) $SiO_2$ Shell

ZnMgO—$SiO_2$ particle was obtained by above 1-(2) step.

3. Synthesis $SnO_2$—$SiO_2$ Electron Transporting Material (1) $SnO_2$ Core

DMSO (30 ml), where 0.1M zinc acetate hydrate was dissolved, and ethanol solution (10 ml), where 0.5M TMAH was dissolved, were mixed and stirred for 1 hr. After completion of the reaction, the mixture was precipitated by using ethyl acetate, and the precipitate was separated by using the centrifuge. By performing the dispersion step using dispersion stabilizer (2-ethanolamine, 160 μl) and the precipitation step using ethanol and ethyl acetate, $SnO_2$ nano-particle was obtained.

(2) $SiO_2$ Shell $SnO_2$—$SiO_2$ particle was obtained by above 1-(2) step.

[Fabrication of QD Emitting Diode]

The QD emitting diode is fabricated by sequentially performing steps below.

(1) depositing ITO (45~50 nm, anode),
(2) coating PEDOT:PSS compound (20~25 nm, HIL),
(3) coating poly[(9,9-dioctylfluorenyl-2,7-diyl)-co-(4,4'-(N-(4-sec-butylphenyl))diphenylamine (TFB) compound (15~20 nm, HTL),
(4) coating red QD (20~25 nm, QD EML),
(5) coating electron transporting material (40~45 nm, ETL), and
(6) depositing Al (75~80 nm, cathode).

1. Comparative Example 1

ZnO (7~8 nm) is used as the electron transporting material.

2. Example 1

ZnO (7~8 nm)-$SiO_2$ (2~3 nm) particle (core-shell) is used as the electron transporting material.

3. Example 2

ZnMgO (7~8 nm)-$SiO_2$ (2~3 nm) particle (core-shell) is used as the electron transporting material.

4. Example 3

$SnO_2$ (7~8 nm)-$SiO_2$ (2~3 nm) particle (core-shell) is used as the electron transporting material.

FIGS. 9A to 9D are graphs showing an emission peak of the QD emitting diode including the electron transporting material with or without a silica shell.

When the ZnO electron transporting material without a silica shell is used to the ETL, the balance between the hole and the electron is destroyed such that the emission may be generated at the interface between the ETL and the QD EML. Namely, as shown in FIG. 9A, not only the emission peak by the QD but also the emission peak by the hole transporting material (TFB) is detected.

Figure 9B:
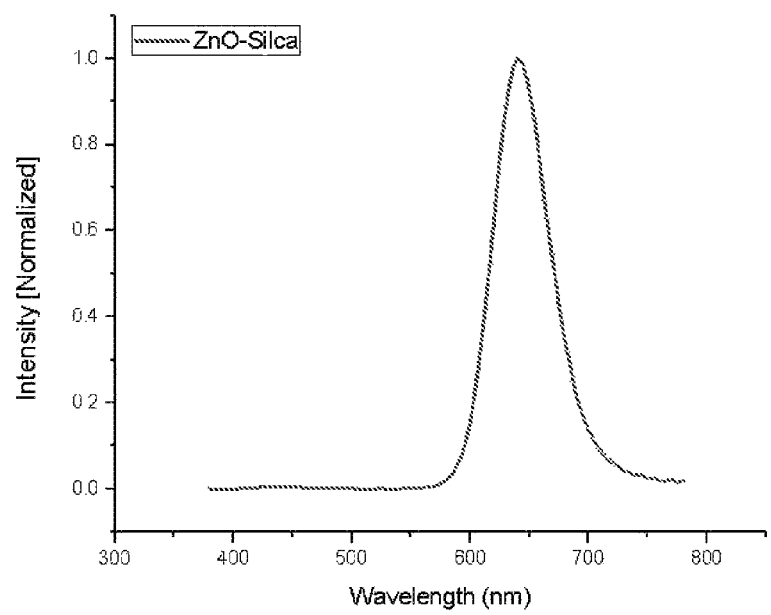
Figure 9C:
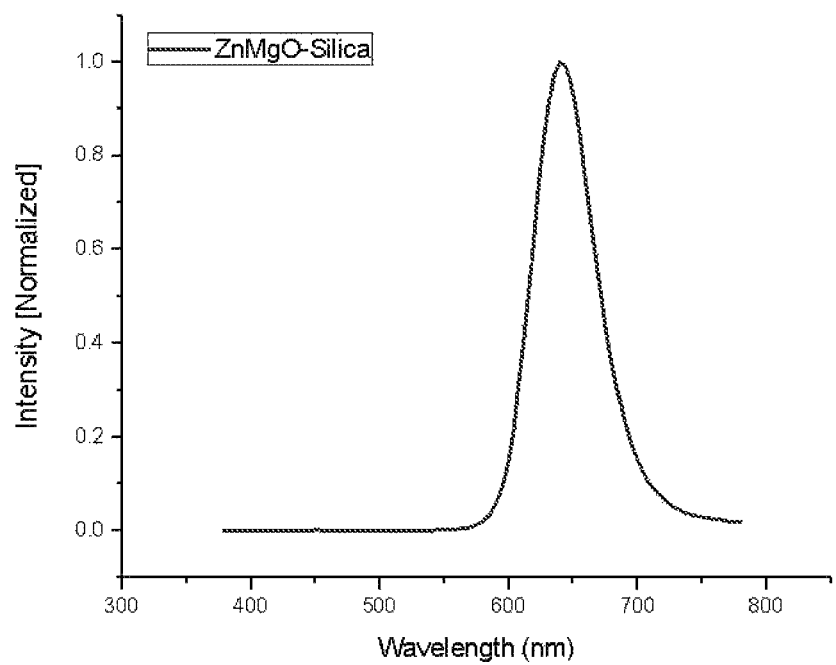
Figure 9D:
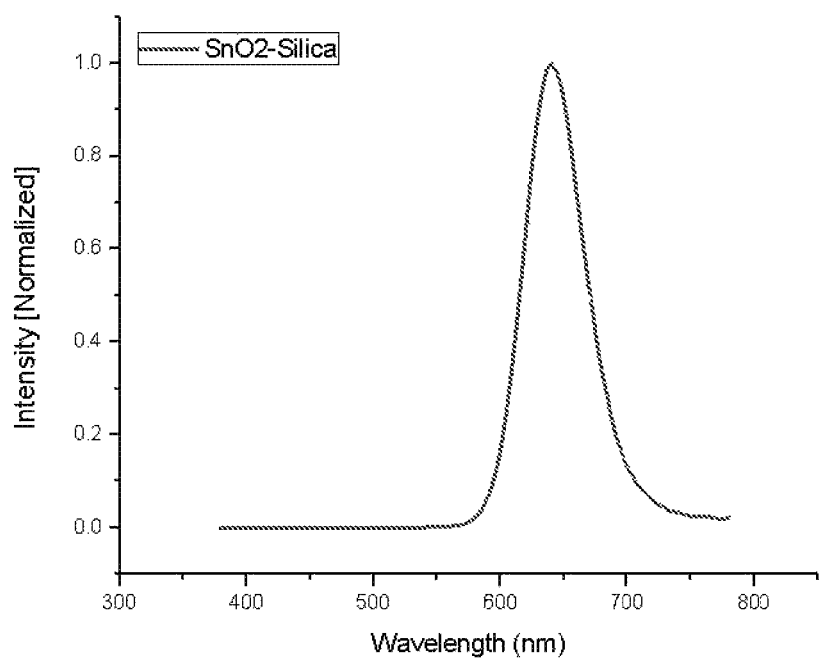

However, when the core-shell structure electron transporting material is used to the ETL (Examples 1 to 3), the emission peak by the hole transporting material is not detected such that the emission property of the QD emitting diode is improved. (FIGS. 9B to 9D)

Figure 10A:
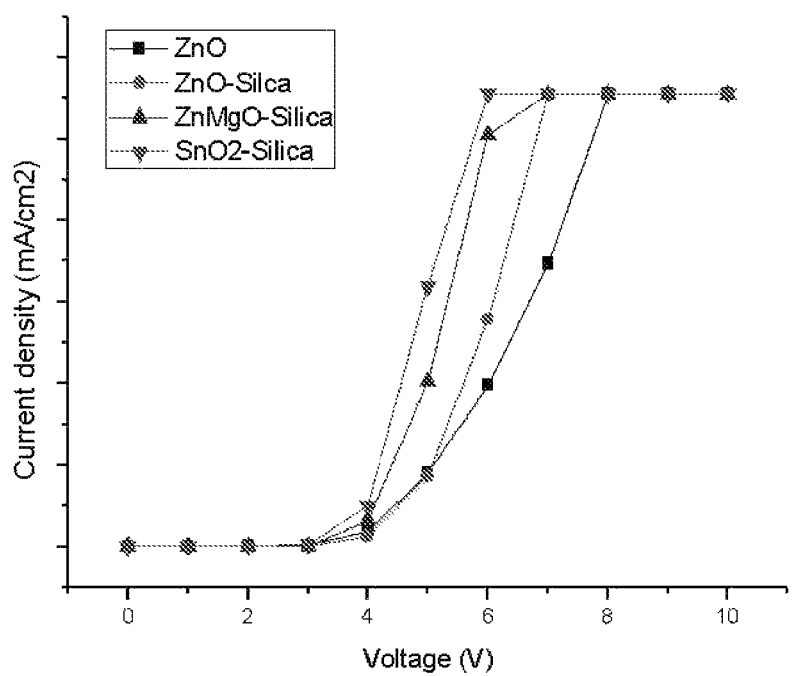
FIGS. 10A to 10C are graphs showing an emitting efficiency of the QD emitting diode including the electron transporting material with or without a silica shell.
Figure 10B:
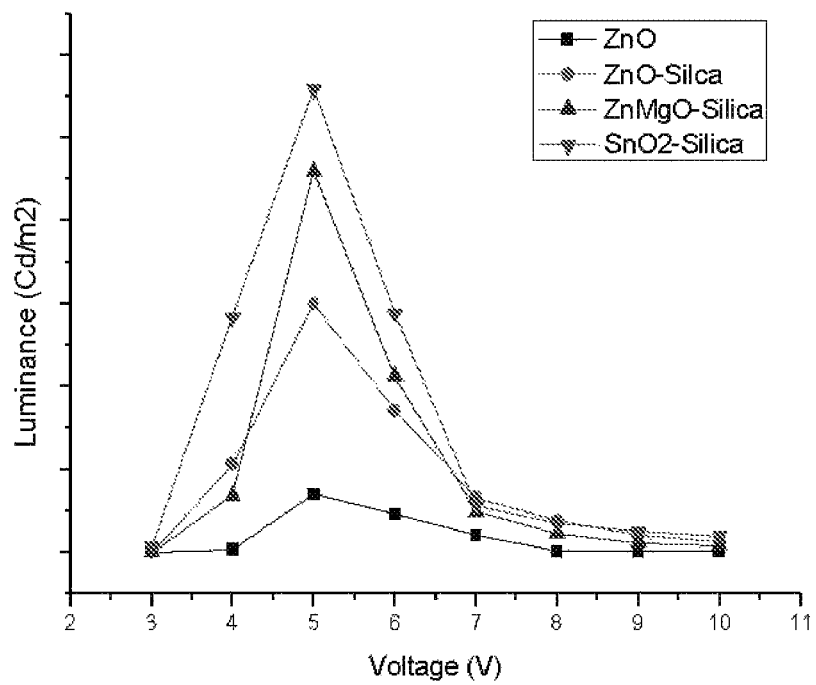
Figure 10C:
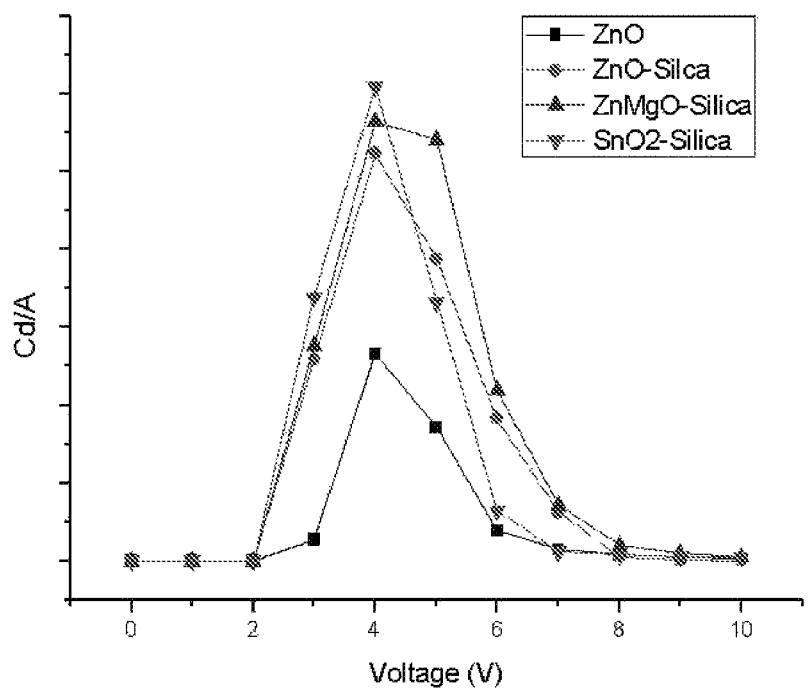

FIGS. 10A to 10C are graphs showing an emitting efficiency of the QD emitting diode including the electron transporting material with or without a silica shell.

As shown in FIGS. 10A to 10C, in comparison to the QD emitting diode of Comparative Example 1, the QD emitting diode of Examples 1 to 3, where the electron transporting material having the metal oxide core and the silica shell, has advantages in the current density, the luminance and the current efficiency (Cd/A).

5. Example 4

ZnO (7~8 nm)-$SiO_2$ particle (core-shell) is used as the electron transporting material.

6. Example 5

ZnMgO (7~8 nm)-$SiO_2$ particle (core-shell) is used as the electron transporting material.

7. Example 6

$SnO_2$ (7~8 nm)-$SiO_2$ particle (core-shell) is used as the electron transporting material.

Figure 11:
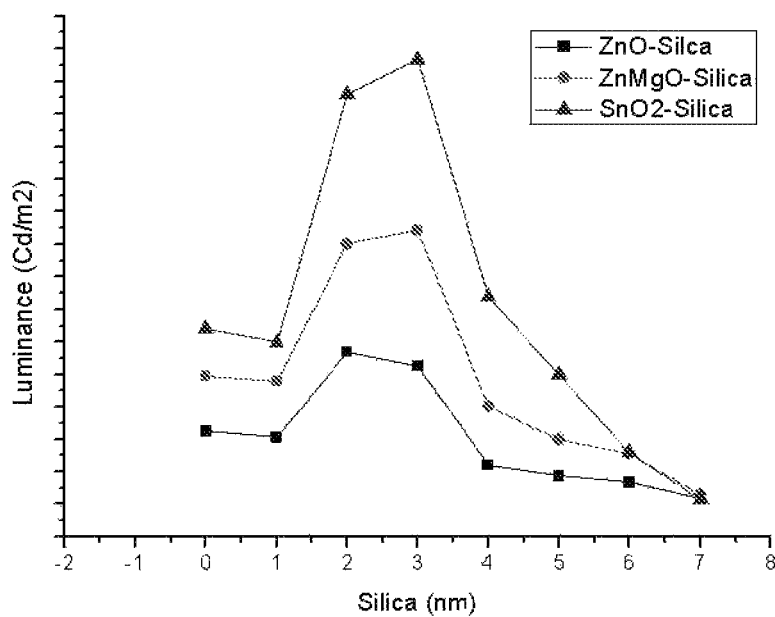
FIG. 11 is a graph showing an emitting efficiency of the QD emitting diode including the electron transporting material of a core-shell structure according to a thickness of the silica shell.

The emitting efficiency of the QD emitting diode is measured and shown in FIG. 11 according to a thickness of the silica shell in the electron transporting materials of Examples 4 to 6.

As shown in FIG. 11, when the thickness of the shell is less than about 1.5 nm, the QD emitting diode has the luminance being similar to the QD emitting diode including the electron transporting material without the shell (thickness=0). When the thickness of the shell is increased, the luminance of the QD emitting diode is increased. On the other hand, when the thickness of the shell is above about 3.5 nm, the luminance of the QD emitting diode may be similar to or lower than that in the QD emitting diode including the electron transporting material without the shell (thickness=0). In other words, in the same voltage driving condition, the QD emitting diode or the QD display device has a first luminance with the silica shell having a first thickness (about 1.5~3.5 nm), a second luminance, which is smaller than the first luminance, with the silica shell having a second thickness, which is smaller than the first thickness, and a third luminance, which is smaller than the first luminance, with the silica shell having a third thickness, which is greater than the first thickness.

Namely, the electron transporting property of the electron transporting material depends on the thickness of the shell. The thickness of the silica shell may have a range of about 1.5 to 3.5 nm, preferably, about 2 to 3 nm.

Figure 12:
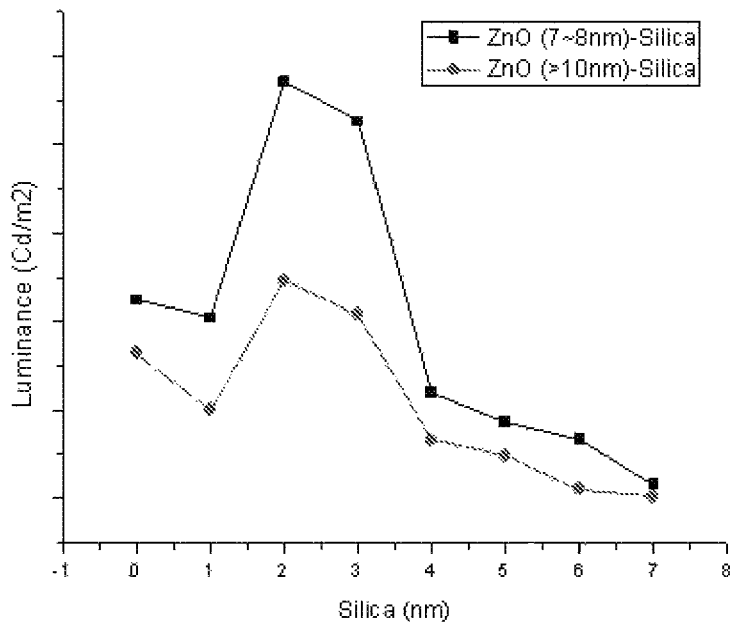
FIG. 12 is a graph showing an emitting efficiency of the QD emitting diode including the electron transporting material of a core-(silica) shell structure according to a size of the core.

As mentioned above, the size of the core is too big, an air gap or a pore is generated between the electron transporting materials or a coating uniformity is degraded. Namely, as shown in FIG. 12, the emitting property (efficiency) of the QD emitting diode is improved with the silica shell having the thickness of about 1.5 to 3.5 nm, while the emitting property advantage is decreased when the size of the core is increased.

Accordingly, in the metal oxide-silica shell (core-shell) material used to the electron transporting material in the QD emitting diode, the core has the size of about 5 to 10 nm, and the shell has the thickness of about 1.5 to 3.5 nm. Preferably, the core has the size of about 7 to 8 nm, and the shell has the thickness of about 2 to 3 nm.

Figure 13:
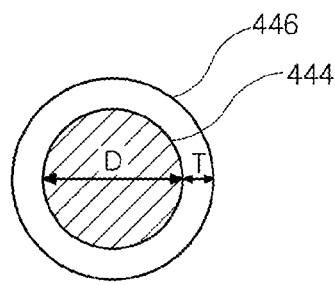
FIG. 13 is a schematic view illustrating an electron transporting material used in the QD emitting diode according to a third embodiment of the present invention.

FIG. 13 is a schematic view illustrating an electron transporting material used in the QD emitting diode according to a third embodiment of the present invention.

Referring to FIG. 13, the electron transporting material 442 includes the core 444 and the shell 446 surrounding (covering or enclosing) the core 444.

The core 444 includes a metal oxide material. For example, the core 444 may include at least one of ZnO, ZnMgO and $SnO_2$. The core 444 has a size, e.g., a diameter, D of about 5 to 10 nm, preferably, about 7 to 8 nm.

When the size D of the core 444 is too small, e.g., less than 5 nm, the electron transporting material 442 does not has a desired energy bandgap. When the size D of the core 344 is too big, e.g., above 10 nm, an air gap or a pore is generated between the electron transporting materials 442 or a coating uniformity is degraded. As a result, the emitting efficiency of the QD emitting diode D is decreased.

The shell 446 encloses the core 444 and includes polyvinyl alcohol (PVA). The electron trap problem by the defect in the core 444 is prevented by the shell 446. The shell 446 may have a thickness T of about 1 to 3 nm, preferably, about 1.5 to 2.5 nm.

When the thickness T of the shell 446 is too small, e.g., less than 1 nm, the uniformity of the shell 446 is secured such that the property of the electron transporting material 442 is degraded. When the thickness T of the shell 446 is too big, e.g., above 3 nm, aggregation of the electron transporting materials 442 may be generated and the electron transport may be blocked by the shell 446.

Referring to FIG. 6, the QD emitting diode D includes the first electrode 110, the second electrode 140 facing the first electrode 110 and the emitting layer 130 therebetween, and the emitting layer 130 includes the QD EML 330, the HTL 320 between the first electrode 110 and the QD EML 330 and the ETL 340 between the QD EML 330 and the second electrode 140.

The emitting layer 130 may further include an HIL 310 between the first electrode 110 and the HTL 320 and an EIL 350 between the second electrode 140 and the ETL 340. At least one of the HIL 310 and the EIL 350 may be omitted.

The ETL 340 includes an electron transporting material 342 and may contact the other surface of the QD EML 330.

Figure 14:
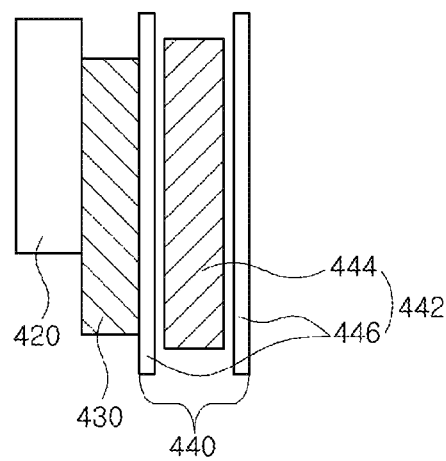
FIG. 14 is a schematic view illustrating an energy diagram in the QD emitting diode according to the third embodiment of the present invention.

Referring to FIG. 14, which is a schematic view illustrating an energy diagram in the QD emitting diode according to the third embodiment of the present invention, the HTL 420 has a HOMO level being higher than a VB level of the QD EML 430.

In addition, the electron transporting material 442 has a CB level being higher than the CB level of the QD EML 430. The PVA shell 446 has an electron mobility being smaller than the metal oxide core 444 and an energy bandgap being greater than the metal oxide core 444. In addition, the PVA shell 446 has a CB level being higher than the metal oxide core 444 and a VB level being lower than the metal oxide core 444. Accordingly, the hole is efficiently blocked by the PVA shell 446, and the electron transporting property of the ETL 440 is decreased. As a result, the charge balance in the QD EML 430 is improved, and the emitting efficiency of the QD display device is also improved.

The charge balance improvement may depend on the thickness T of the PVA shell 446, and the electron transporting (injection) property and the hole blocking property by the PVA shell 446 may be controlled by controlling the thickness T of the PVA shell 446.

In addition, PVA is used as a shell 446 for the core 444, there is no dispersion problem in silica and metal oxide such that the ETL 440 may be formed by a solution process. In this instance, since all elements of the emitting layer 130 can be formed by the solution process, a large-size QD display device can be efficiently manufactured.

[Synthesis]

4. Synthesis ZnO-PVA Electron Transporting Material

ZnO nano-particles (25 mg), which was obtained by the synthesis 1-(1), were dispersed in ethanol (20 ml), and oleic acid (0.2 g, 1 wt %) was added. The mixture was stirred for 1 hr. After centrifugation, the particles were washed by toluene in 4 times to remove non-reacted coupling agent. The mixture was dried under the room temperature for one night.

(Surface Modification of ZnO Nano-Particle)

The surface-modified ZnO particle was inserted into PVA solution, in which polyvinyl alcohol (99.5%) was dispersed in ethanol, and the mixture was stirred under the temperature of 40° C. for 4 hrs. The centrifugation process is performed to obtain ZnO-PVA particle.

5. Synthesis ZnMgO-PVA Electron Transporting Material

Instead of ZnO nano-particle in Synthesis 4, ZnMgO particle, which was obtained by Synthesis 2-(1), was used to obtain ZnMgO-PVA particle.

6. Synthesis $SnO_2$-PVA Electron Transporting Material

Instead of ZnO nano-particle in Synthesis 4, $SnO_2$ particle, which was obtained by Synthesis 3-(1), was used to obtain $SnO_2$-PVA particle.

[Fabrication of QD Emitting Diode]

The QD emitting diode is fabricated by sequentially performing steps below.

(1) depositing ITO (45~50 nm, anode),
(2) coating PEDOT:PSS compound (25~30 nm, HIL),
(3) coating N4,N4'-di(Naphthalen-1-yl)-N4,N4'-bis(4-vinylphenyl)biphenyl-4,4'-diamine (VNPB) compound (20~25 nm, HTL),
(4) coating blue QD (20~25 nm, QD EML),
(5) coating electron transporting material (30~35 nm, ETL), and
(6) depositing Al (75~80 nm, cathode).

1. Comparative Example 2

ZnO (7~8 nm) is used as the electron transporting material.

2. Example 7

ZnO (7~8 nm)-PVA (2~3 nm) particle (core-shell) is used as the electron transporting material.

3. Example 8

ZnMgO (7~8 nm)-PVA (2~3 nm) particle (core-shell) is used as the electron transporting material.

4. Example 9

$SnO_2$ (7~8 nm)-PVA (2~3 nm) particle (core-shell) is used as the electron transporting material.

FIGS. 15A to 15D are graphs showing an emission peak of the QD emitting diode including the electron transporting material with or without a PVA shell.

Figure 15A:
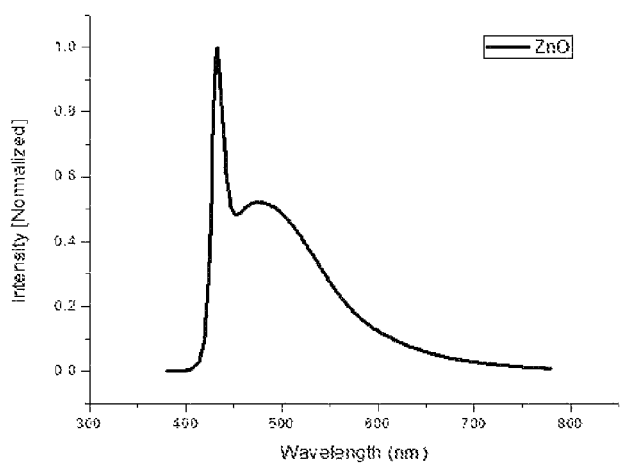
FIGS. 15A to 15D are graphs showing an emission peak of the QD emitting diode including the electron transporting material with or without a PVA shell.

When the ZnO electron transporting material without a PVA shell is used to the ETL, the balance between the hole and the electron is destroyed such that the emission may be generated at the interface between the ETL and the QD EML. Namely, as shown in FIG. 15A, not only the emission peak by the QD but also the emission peak by the hole transporting material (VNPB) is detected.

Figure 15B:
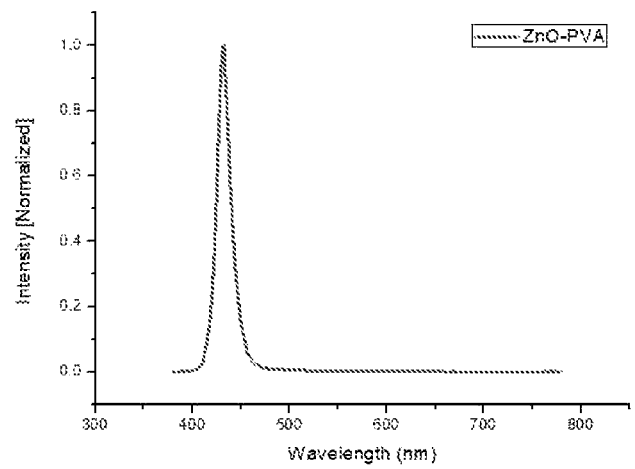
Figure 15C:
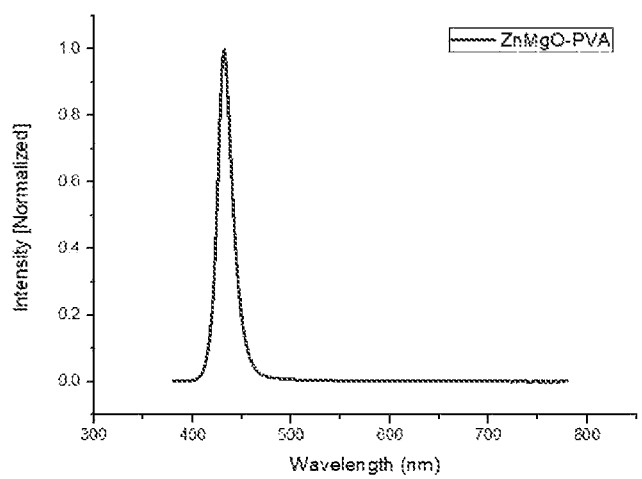
Figure 15D:
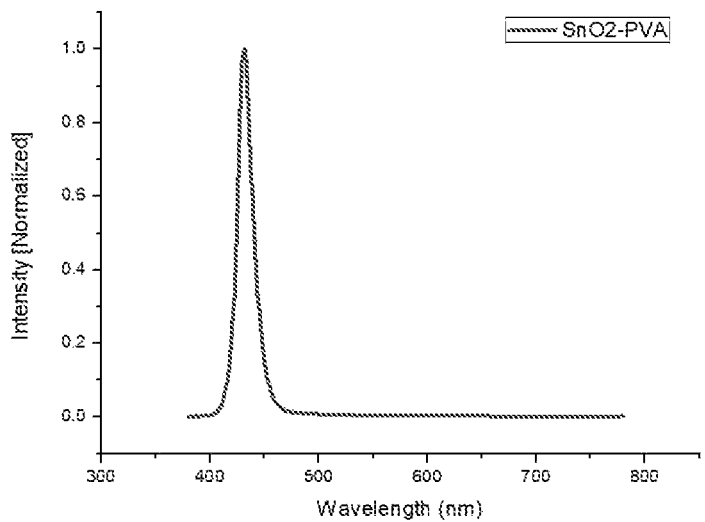

However, when the electron transporting material including the metal oxide core and the PVA shell is used to the ETL (Examples 7 to 9), the emission peak by the hole transporting material is not detected such that the emission property of the QD emitting diode is improved. (FIGS. 15B to 15D)

5. Example 10

ZnO (7~8 nm)-PVA particle (core-shell) is used as the electron transporting material.

6. Example 11

ZnMgO (7~8 nm)-PVA particle (core-shell) is used as the electron transporting material.

7. Example 12

$SnO_2$ (7~8 nm)-PVA particle (core-shell) is used as the electron transporting material.

Figure 16:
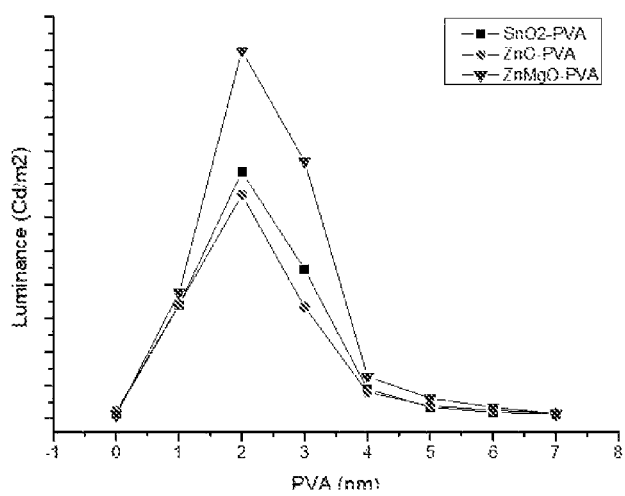
FIG. 16 is a graph showing an emitting efficiency of the QD emitting diode including the electron transporting material of a core-shell structure according to a thickness of the PVA shell.

The emitting efficiency of the QD emitting diode is measured and shown in FIG. 16 according to a thickness of the PVA shell in the electron transporting materials of Examples 10 to 12.

As shown in FIG. 16, the luminance of the QD emitting diode is increased by the PVA shell. When the thickness of the PVA shell has a range of about 1 to 3 nm, the luminance of the QD emitting diode is significantly increased. On the other hand, when the thickness of the PVA shell is above about 3 nm, the luminance of the QD emitting diode is decreased.

In the same voltage driving condition, the QD emitting diode or the QD display device has a first luminance with the PVA shell having a first thickness (about 1~3 nm), a second luminance, which is smaller than the first luminance, with the PVA shell having a second thickness, which is smaller than the first thickness, and a third luminance, which is smaller than the first luminance, with the PVA shell having a third thickness, which is greater than the first thickness.

Namely, the electron transporting property of the electron transporting material depends on the thickness of the PVA shell. The thickness of the PVA shell may have a range of about 1 to 3 nm.

It will be apparent to those skilled in the art that various modifications and variations can be made in the quantum dot emitting diode and the quantum dot display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A quantum dot emitting diode, comprising:
   first and second electrodes facing each other;
   a quantum dot emitting material layer between the first and second electrodes; and
   an electron transporting layer including an electron transporting material and disposed between the quantum dot emitting material layer and the second electrode,
   wherein the electron transporting material includes:
      a core including metal oxide and having a size of about 7 to 8 nm; and
      a shell covering the core, the shell including silica and having a thickness of about 2 to 3 nm, and
   wherein the electron transporting material is configured to transport electrons from the second electrode into the quantum dot emitting material layer where:
      the core and the shell of the electron transporting material has a conduction band level higher than a conduction band level of the quantum dot emitting material layer;
      the shell has an electron mobility smaller than an electron mobility of the core;
      the shell has an energy bandgap greater than an energy bandgap of the core;
      the shell has a conduction band level higher than a conduction band level of the core; and
      the shell has a valance band level lower than a valance band level of the core.

2. The quantum dot emitting diode according to claim 1, wherein the core includes at least one of ZnO, ZnMgO and $SnO_2$.

3. The quantum dot emitting diode according to claim 1, wherein the core includes ZnMgO or $SnO_2$.

4. The quantum dot emitting diode according to claim 1, wherein the core includes ZnMgO.

5. The quantum dot emitting diode according to claim 1, wherein the core includes $SnO_2$.

6. The quantum dot emitting diode according to claim 1, further comprising: a hole transporting layer between the first electrode and the quantum dot emitting material layer.

7. The quantum dot emitting diode according to claim 1, further comprising:
   a hole transporting layer between the first electrode and the quantum dot emitting material layer,
   wherein a highest occupied molecular orbital level of the hole transporting layer is higher than a valance band level of the quantum dot emitting material layer, and
   wherein a hole from the hole transporting layer is blocked by the shell.

8. A quantum dot display device, comprising:
   a substrate;
   a quantum dot emitting diode on the substrate, the emitting diode including:
      first and second electrodes facing each other;
      a quantum dot emitting material layer between the first and second electrodes; and
      an electron transporting layer including an electron transporting material and disposed between the quantum dot emitting material layer and the second electrode; and
   a thin film transistor disposed between the substrate and the quantum dot emitting diode and connected to the quantum dot emitting diode,
   wherein the electron transporting material includes:
      a core including metal oxide and having a size of about 7 to 8 nm; and
      a shell covering the core, the shell including silica and having a thickness of about 2 to 3 nm, and
   wherein the electron transporting material is configured to transport electrons from the second electrode into the quantum dot emitting material layer where:
      the core and the shell of the electron transporting material has a conduction band level higher than a conduction band level of the quantum dot emitting material layer;
      the shell has an electron mobility smaller than an electron mobility of the core;
      the shell has an energy bandgap greater than an energy bandgap of the core;

the shell has a conduction band level higher than a conduction band level of the core; and the shell has a valance band level lower than a valance band level of the core.

* * * * *